United States Patent [19]

Asakawa

[11] Patent Number: 4,986,715

[45] Date of Patent: Jan. 22, 1991

[54] STOCK UNIT FOR STORING CARRIERS

[75] Inventor: Teruo Asakawa, Yamanashi, Japan

[73] Assignee: Tokyo Electron Limited, Tokyo, Japan

[21] Appl. No.: 423,591

[22] Filed: Oct. 17, 1989

Related U.S. Application Data

[63] Continuation of Ser. No. 218,264, Jul. 13, 1988, abandoned.

[51] Int. Cl.$^5$ ............................................. B65G 1/133
[52] U.S. Cl. .................................... 414/331; 98/115.3; 211/41; 211/163; 414/283; 414/787
[58] Field of Search ............... 414/787, 331, 217, 281, 414/276, 277, 283, 223; 98/115.3; 211/163, 144, 131, 41

[56] References Cited

U.S. PATENT DOCUMENTS

| 3,554,391 | 1/1971 | Goodell | 414/331 |
|---|---|---|---|
| 3,854,604 | 12/1974 | Peterson et al. | 414/277 |
| 3,977,542 | 8/1976 | Stolzer | 414/281 X |
| 4,636,128 | 1/1987 | Millis et al. | 414/217 |
| 4,643,629 | 2/1987 | Takahashi et al. | 414/331 |
| 4,651,863 | 3/1987 | Reuter et al. | 414/787 X |
| 4,659,281 | 4/1987 | Aupperle | 414/787 |
| 4,660,464 | 4/1987 | Tanaka | 98/115.3 |
| 4,701,096 | 10/1987 | Fisher, Jr. | 414/331 X |
| 4,726,725 | 2/1988 | Baker et al. | 414/283 |
| 4,867,629 | 9/1989 | Iwasawa et al. | 414/217 X |

FOREIGN PATENT DOCUMENTS

| 59-102581 | 6/1984 | Japan . | |
|---|---|---|---|
| 60-39844 | 3/1985 | Japan . | |
| 52405 | 3/1985 | Japan | 414/331 |
| 60-79710 | 5/1985 | Japan . | |
| 60-79710 | 5/1985 | Japan . | |
| 60-220924 | 11/1985 | Japan . | |
| 124404 | 6/1986 | Japan | 414/276 |
| 131845 | 6/1986 | Japan | 414/331 |
| 155108 | 7/1986 | Japan | 414/277 |
| 61-263502 | 11/1986 | Japan . | |
| 61-263503 | 11/1986 | Japan . | |
| 1172840 | 8/1985 | U.S.S.R. | 414/331 |

Primary Examiner—David A. Bucci
Attorney, Agent, or Firm—Oblon, Spivak, McClelland, Maier & Neustadt

[57] ABSTRACT

A stock unit for carriers includes a stocker having shelves, for storing carriers containing semiconductor wafers, a mounting port on which the carriers are temporarily mounted, and a handler for transporting the carriers between the shelf and the mounting port.

7 Claims, 7 Drawing Sheets

STOCK UNIT FOR STORING CARRIERS

This application is a Continuation of application Ser. No. 07/218,264, filed on July 13, 1988.

BACKGROUND OF THE INVENTION

1. Field of the Invention

The present invention relates to a stock unit for storing carriers which are themselves used for storing semiconductor wafers or the like.

2. Description of the Related Art

Stock units for storing carriers each of which holds a plurality of wafers, are used in factories where semiconductor devices are manufactured. The stock units are installed between the places where the wafers undergo various processes, and are used to store temporarily the carriers each holding wafers and also to protect the wafers from accidental damage.

The stock units hitherto known and used are so-called "single-port units". Each of them has only one port through which carriers are inserted into, and pulled out of, the stock unit, either manually or by means of industrial robots. The workers, who are going to insert or pull the carrier from the stock unit, may interfere with each other. Further, it is possible that the robots and/or workers interfere with each other. To prevent an accident of this type, the robot must be strictly controlled. In addition, stockers storing the carriers and the places or environments where the carriers are temporarily located must be kept as clean as possible, using filters, since the carriers store semiconductor wafers. However, the filters are restricted in their fitting positions on the stocker units, even with the single-port units. It is, therefore, more difficult to design a multi-port stock unit which has more than one port.

The conventional stock units have been made in accordance with the customers' specifications. This is because, on which side the stock port should have the port depends on where in the factory the stock unit is installed. They cannot be manufactured in large quantities.

SUMMARY OF THE INVENTION

An object of the present invention is to provide a stock unit for storing carriers each holding a plurality of wafers, which is designed to prevent persons or a carrier-transporting means from interfering with one another while transporting the carrier, and which can be used in combination with a handler capable of transferring the carriers to and from any desired position within the stock unit.

According to an aspect of the invention, there is provided a stock unit which comprises: a stocker comprising a housing and shelf or rack means provided in the housing, for supporting carriers, each containing objects which are to be processed; mounting means for temporarily mounting thereon the carriers to be supplied to or from the shelf means; and transfer means for transferring the carriers from the mounting means to the shelf means and vice versa.

According to another aspect of this invention, there is provided a stock unit which comprises: a stocker comprising a housing and shelf or rack means provided in the housing, for supporting carriers, each containing objects which are to be processed; mounting means for temporarily mounting thereon the carriers to be supplied to or from the shelf means; transfer means for transferring carriers from the mounting means to the shelf means and vice versa; and means for applying clean air in a predetermined direction, to the objects in the carriers at the shelf means, the mounting means, and the transfer means, respectively.

According to still another aspect of the present invention, there is provided a stock unit which comprises: a stocker comprising a housing and shelf or rack means provided in the housing, for supporting carriers, each containing objects which are to be processed; a plurality of mounting means for temporarily mounting thereon the carriers to be supplied to or from the shelf means; and transfer means for transferring carriers from the mounting means to the shelf means and vice versa.

In the stock unit according to the invention, a plurality of box-like compartments are provided on the rack or shelf means, each box-like compartment for receiving the carrier. The shelf means includes shelves. The shelves are substantially circular plates. Preferably, they are arranged, one above another, and can be rotated. The carrier contains semiconductor wafers, liquid-crystal substrates, or similar plate-like objects.

The stock unit according to a second embodiment of the invention has a plurality of stockers and also a transfer means for transferring carriers to and from the shelves incorporated in these stockers.

The stock unit according to a third embodiment of the invention has means for applying clean air in a predetermined direction, to the objects in the carriers at the shelves, the mounting means, and the transfer means, so that the air flows along both sides of each object held within the carrier, or flows between the adjacent objects The predetermined direction is the direction in which the objects (e.g., wafers) are inserted into, and removed from, the carriers As has been described above, the stock unit according to the invention comprises a plurality of stockers, mounting means for temporarily mounting thereon the carriers, and transfer means for transferring carriers between the mounting means and the rotatable shelves incorporated in these stockers Therefore, any carrier can be supplied to and from a desired shelf incorporated in any stocker. Since the stock unit includes nothing which would interfere with the transfer means, the carriers are smoothly transferred between any shelf and the mounting means.

BRIEF DESCRIPTION OF THE DRAWINGS

FIGS. 1 through 7 show a stock unit according to the present invention.

FIG. 1 is a plan view showing an arrangement of stockers which form the stock unit;

FIG. 2 is a vertical sectional view showing the stockers;

FIG. 3 is an enlarged, cross-sectional view showing the stocker;

FIG. 7 shows another arrangement of multi-ports with respect to the stocker.

DETAILED DESCRIPTION OF THE PREFERRED EMBODIMENTS

A stock unit according to the present invention, designed for storing carriers, will be described with reference to FIGS. 1 through 7.

Figure 1:
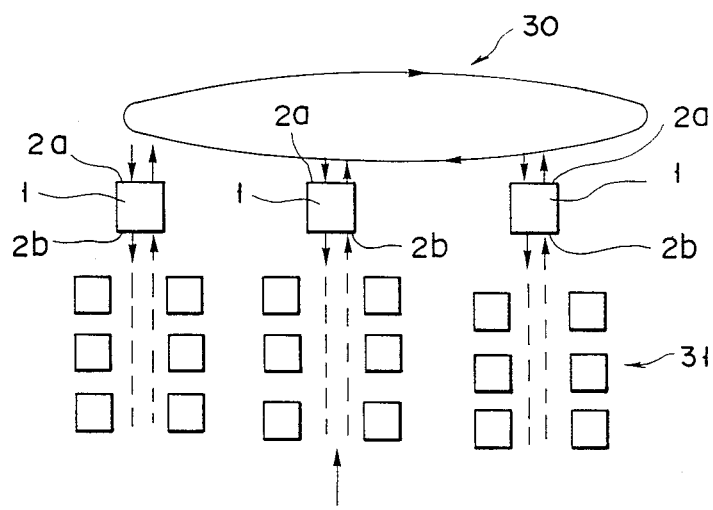

As is shown in FIG. 1, stockers or stock unit bodies 1, which form the stock unit of the present invention, are arranged between transporting system 30 for connecting processes and transporting system 31 used in one process Each stocker 1 has, at its opposed sides, two openings 2a and 2b through which carriers holding objects to be treated are brought into, and out of, stocker 1. Since stockers 1 are arranged as is shown in FIG. 1, the carrier being transported to or from one stocker 1 by processes connecting transport system 30 does not interfere with the carrier being transported to or from another stocker 1 by in-one-process-running transport system 31. Thus, the carriers are smoothly brought into and out of stockers 1.

Stocker 1 will be described in more detail with reference to FIGS. 2 and 3.

Stocker 1 has a case which consists of rectangular frame 3. Shelves 4 are fastened to frame 3. Box-like compartments 32 for storing carriers 12 are provided on each shelf 4.

Shelves 4 are disks 4a spaced one above another, at certain intervals, and are rotatable. They are concentric, and define a cylinder.

Each disk 4a has an opening 6 in the center thereof. Filter 10 is located at that side of box-like compartment 32 which faces opening 6. A receptacle 4b on which carrier 12 is mounted is provided in box 32.

Shelves 4 are arranged on base 7 and made rotatable through drive mechanism 8. The drive mechanism comprises ball bearings 8a and 8b. Thus, the shelves as a unit, which comprises the boxes 32, are freely movable on the base 7 because of the presence of ball bearings 8a and 8b of drive mechanism 8. Fan 9 for sending wind is provided in base 7.

Fan 9 serves to radially send air 35 into box-like compartments 32 through opening 6 and filters 10. Filter 10 cleans air 35. The objects stored in carriers are cleaned by this air. The air is directed to clean the front and back of each of the objects held in carriers 12 stored in box-like compartment 32, each on transport means and ports 33, which will be described later.

Carriers 12 are brought in and out of box-like compartment 32 by handler mechanism 5 which serves as the transport means.

Figure 2:
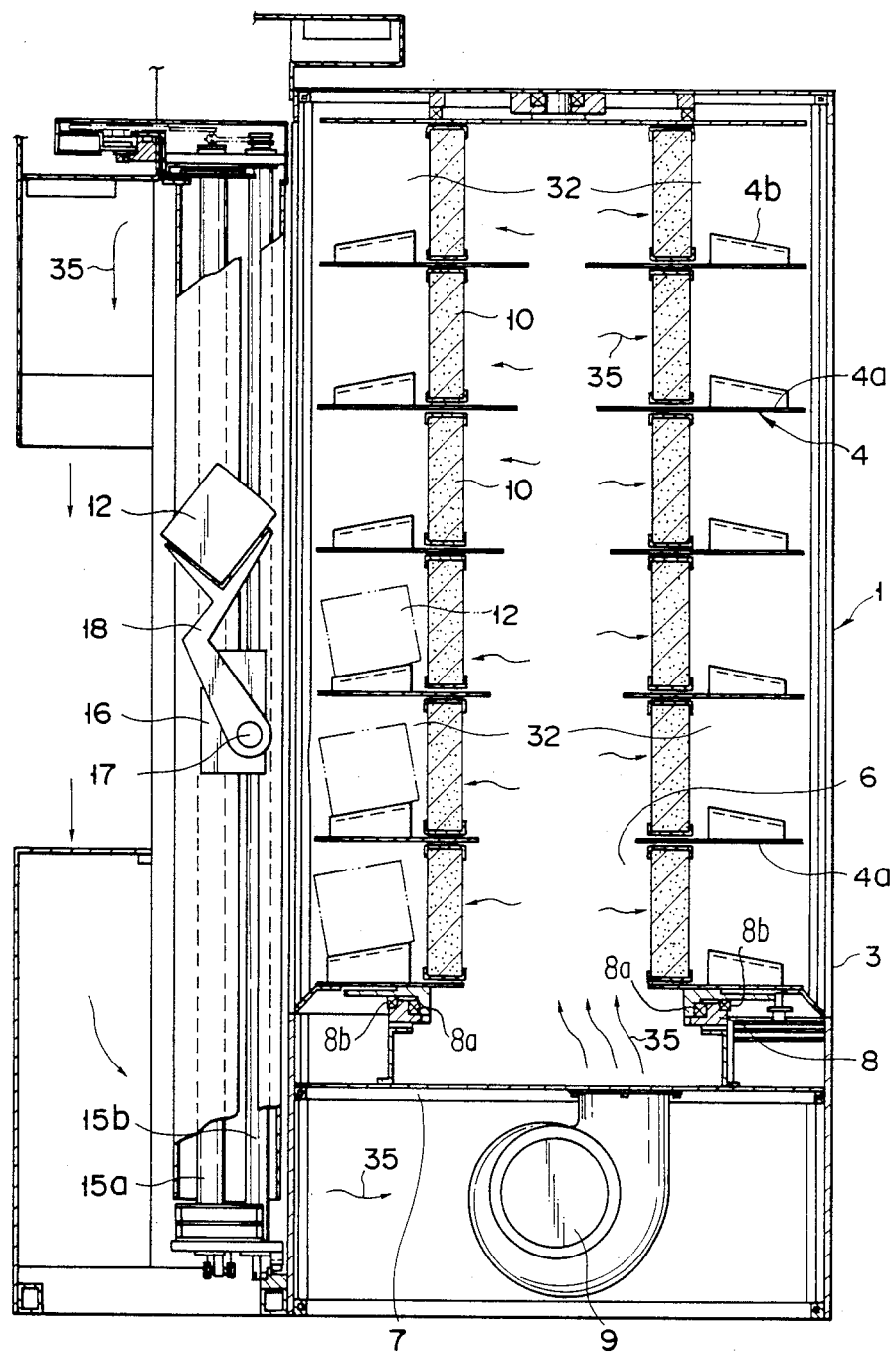
Figure 3:
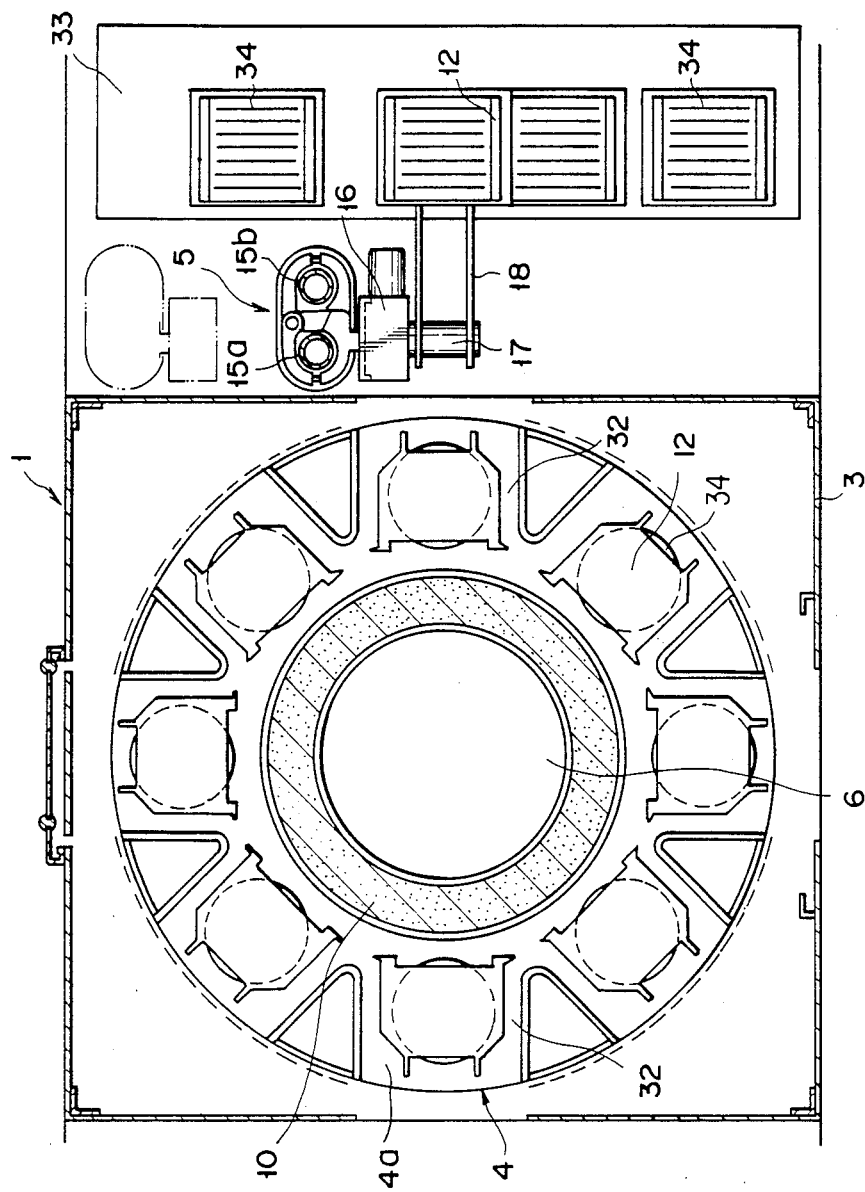

Handler mechanism 5 freely moves between stocker 1 and carriers mounting ports 33, as shown in FIGS. 2 and 3. Handler mechanism 5 moves freely in the horizontal direction through horizontal guide members attached to stocker 1 while it moves up and down along vertical shafts 15a and 15b attached to stocker 1 through lift member 16. Swing shaft 17 is attached to 17 to hold carrier 12 with its bottom seated on them.

More specifically, the transport means is formed by the handler mechanism 5, in the embodiment in FIGS. 2 and 3. The handler mechanism 5 is vertically moved by the lift member 16, the movement being guided by the vertical shafts 15a and 15b. On the other hand, handler mechanism 5 is horizontally moved together with the vertical shafts 15a, 15b by a driving means, not shown in the drawings, the movement being guided by guide members. In short, the arms 18 are freely moved both vertically and horizontally relative to the boxes 32 within the stocker 1 by the vertical and horizontal movement of the handler mechanism 5 explained above. The arrows in FIG. 2 illustrate the movement of the arms 18 about the swing shaft 17.

Receptacles on which carriers 12 are mounted are provided on carriers mounting ports 33. The objects stored in carrier 12 are plural plate-like semiconductor wafers 34 or liquid crystal substrates, for example. The wafers 34 are substantially horizontally disposed when the carriers 12 are positioned within the box like compartments 32 and vertically disposed when the carriers are positioned on the mounting ports 33.

According to the stock unit for storing carriers having the above-described arrangement, shelves 4 are provided in stocker 1 and made rotatable therein.

Handler mechanism 5 is provided to freely carry carriers 12 between stocker 1 and carriers mounting port 33. Handler mechanism 5 can easily bring carriers in and out of a certain side of stocker 1. In addition, another handler mechanism 5 can be easily added to the other side of stocker 1. This added handler mechanism 5 (not shown) can bring carriers 12 in and out without being disturbed by the other handler mechanism 5. Even when processes connecting transport system 30 and in-one-process-running transport system 31 are connected to the same stock unit, therefore, each of the carriers 12 can be brought in and out to the same stocker 1 almost at the same time. As a result, a stock unit which can meet any needs of the users can be provided with more easiness.

Advantages of the stock unit for storing carriers according to the present invention can be further used to their utmost extent when the number and arrangement of stocker 1, transport means and carriers mounting ports are changed as shown in FIGS. 4 through 7, for example.

Figure 4A:
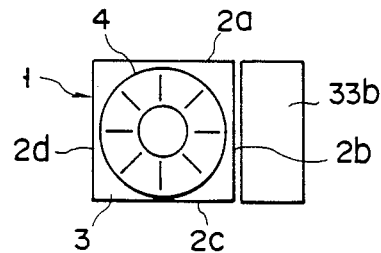
FIGS. 4A through 4E are plans showing how multi-ports are located with respect to the stocker.
Figure 4B:
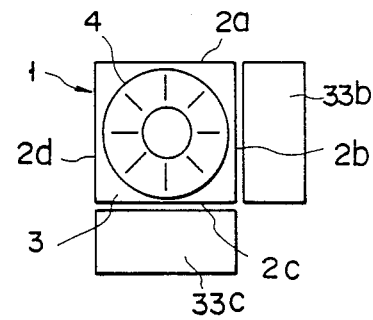
Figure 4C:
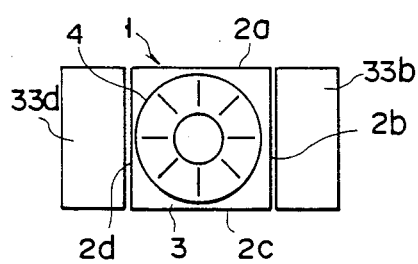
Figure 4D:
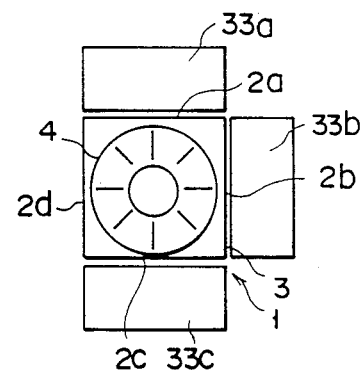

FIGS. 4A-4E show cases where openings 2a-2d through which carriers 12 are brought in and out are provided at optional ones of four sides of stocker 1 and carriers mounting ports 33 are arranged opposite to these openings. FIG. 4A shows the case where opening 2b is formed at a predetermined one of four sides of stocker 1 and carriers mounting port 33b is arranged opposite to opening 2b. FIG. 4B shows the case where carriers mounting ports 33b and 33c are arranged opposite to openings 2b and 2c formed at predetermined two of four sides of stocker 1. FIG. 4C shows the case where carriers mounting ports 33b and 33d are arranged opposite to openings 2b and 2d formed at opposed two of four sides of stocker 1. In the cases shown in FIGS. 4B and 4C, the stock unit can be used as those arranged between the processes connecting transport and the in-one-process-running transport. FIG. 4D shows the case where carriers mounting ports 33a, 33b and 33c are arranged opposite to openings 2a, 2b and 2c formed at three of four sides of stocker 1. The transport means are provided at three sides of stocker 1 in this case. Opening 2a is used for the processes connecting transport, for example. Opening 2b is used as one through which carriers 12 are brought in and out by the operator. Opening 2c is used for the in-one-process-running transport. Opening 2d is provided with a door or the like and can be used as the operator's access side at the time of emergency such as power stop and device breakdown.

Figure 4E:
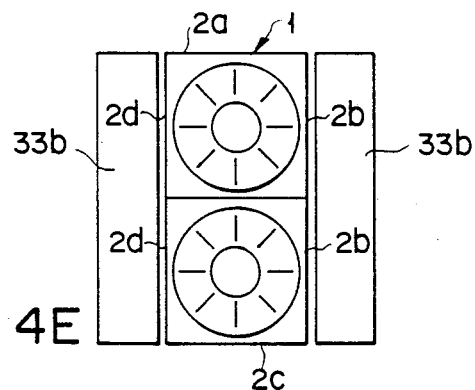

FIG. 4E shows a case where two stockers 1 are connected to each other to increase the number of carriers 12 stored. These carriers storing stock units can be used similarly to the one shown in FIG. 4C.

Figure 5B:
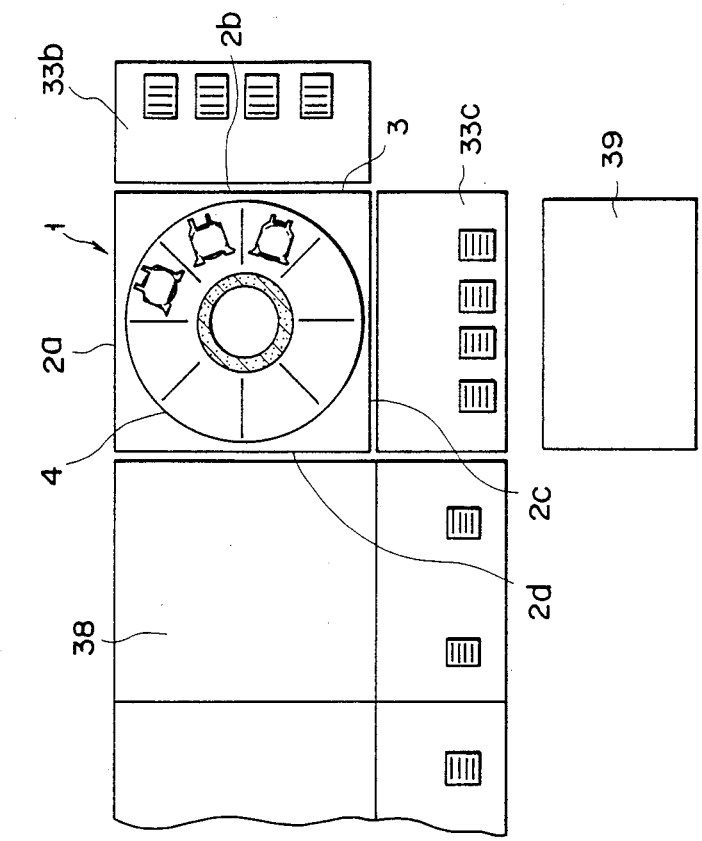
FIG. 5B is an enlarged view of part a of FIG. 5A.
Figure 5A:
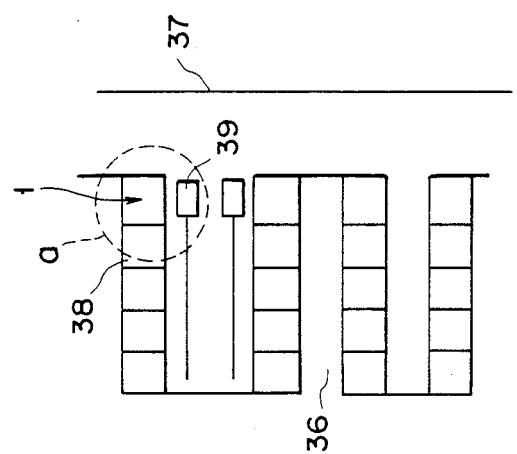
FIG. 5A is a plan view showing another stocker used in the present invention.

FIG. 5A shows a case where the stock unit body shown in FIG. 4B is housed in a treatment room which is provided with machine chamber 36, passage 37 and treatment devices 38. FIG. 5B shows main portion (a) in FIG. 5A enlarged. Numeral 39 in FIGS. 5A and 5B denotes a transport vehicle.

Figure 6A:
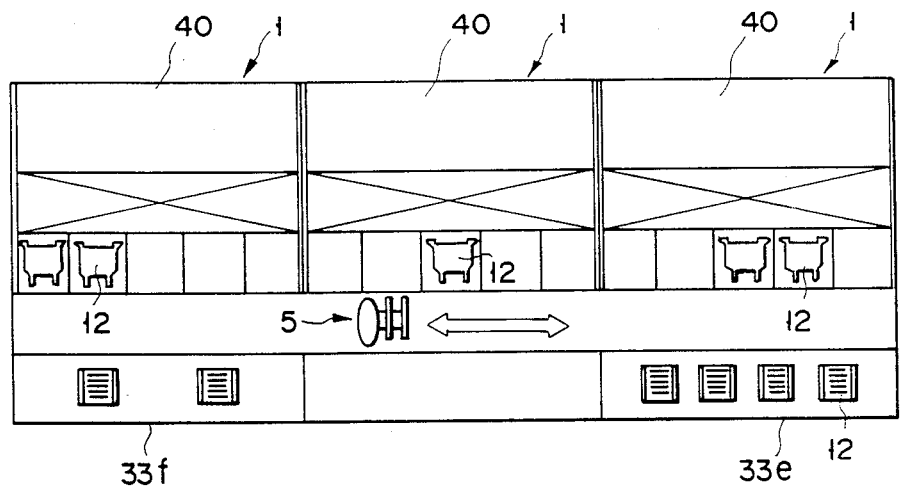
FIG. 6A is a plan view showing another stocker according to the present invention, which has flat shelves.
Figure 6B:
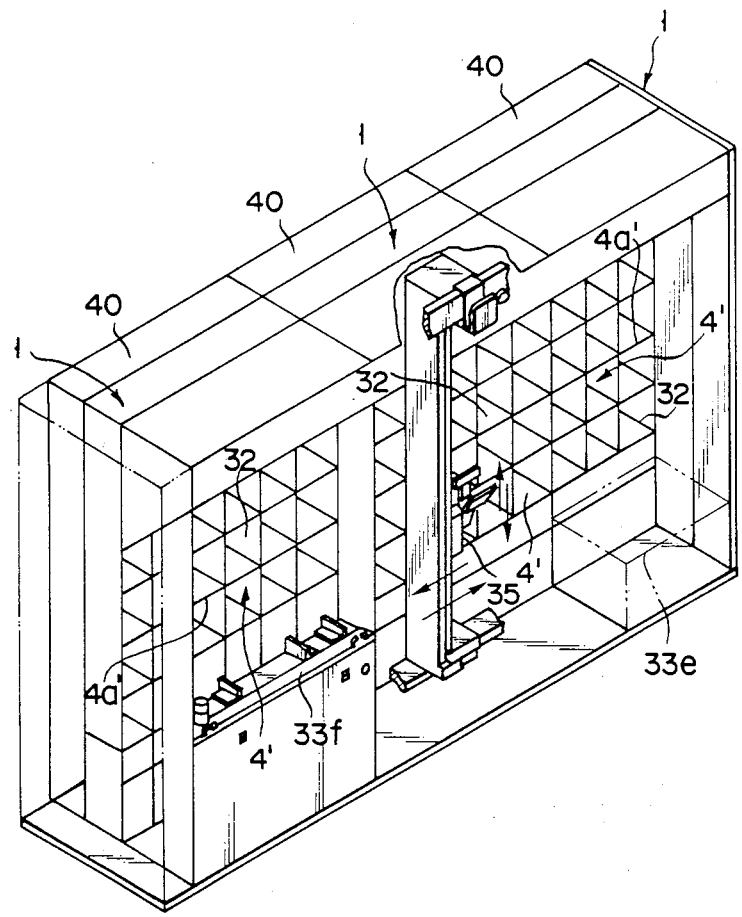
FIG. 6B is a perspective of view the stocker shown in FIG. 6A.

FIG. 6A is a plan showing a variation of the stock unit for storing carriers and FIG. 6B is a front view showing this stock unit for storing carriers Shelves 4' are formed in this case by piling plates 4a' in plural layers at a certain interval. Plural box-like compartments 32 are provided on each of plates 4a'. Three stockers 1 each arranged like this are located side by side in series. Carriers mounting ports 33e and 33f are provided in front of stockers 1 located on both sides. Handler mechanism 35 runs along stockers 1 and between carriers mounting ports 33e, 33f and stockers 1. Pressure chambers 40 are located behind each of stockers 1.

Figure 7:
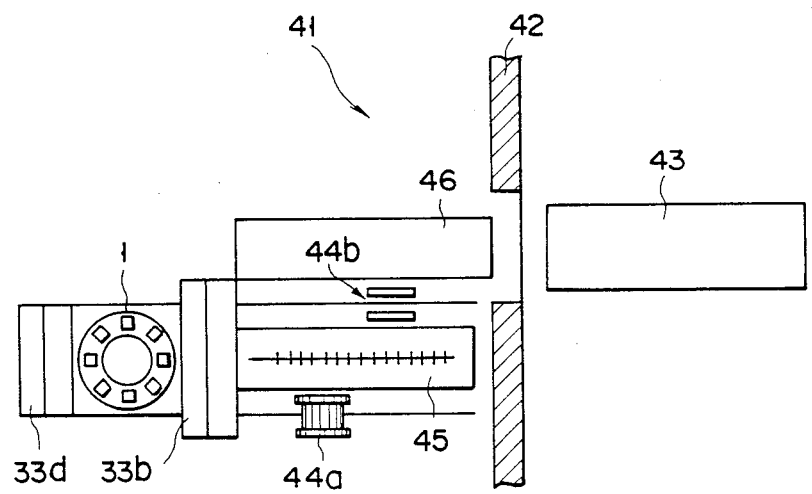

FIG. 7 shows a case where the stock unit for storing carriers is applied to the heat treatment device which is a component of the semiconductor manufacturing apparatus.

Semiconductor wafers stored in six carriers 12 are usually mounted on boat 45. They are exposed to specific gas atmosphere and heat-treated. They are usually located outside wall 42 of clean room 41 because heating section 43 is dirty.

The flow of semiconductor wafers in this case will be described.

Carriers 12 in which semiconductor wafers are stored are mounted on one 33d of the carriers mounting ports. They are held ready on shelves 4 in stocker 1 till predetermined boat 45 becomes available. They are then put on carriers mounting port 33b at the time when boat 45 becomes available. The semiconductor wafers are picked up from carriers on port 33b and mounted on boat 45 by pickup means 44a and 44b. A predetermined number of the semiconductor wafers are mounted on boat 45. Boat 45 is then inserted into heating section 43 from that area where the wafers are mounted on boat 45 by boat moving means 46. The semiconductor wafers are subjected to a treatment needed in heating section 43. Reversely to the above process, the semiconductor wafers are then moved from boat 45 to carriers 12. Carriers 12 are held ready for a next process in stocker 1.

The stock unit serves as a buffer for carriers 12 in this case. Even in the case of the batch system in which six carriers 12 are treated as a unit, therefore, the bringing-in and -out of carriers 12 can be successively carried out. Even when automatic transport systems are provided, therefore, no jamming of carriers 12 is caused. Further, it does not happen that the treatment device is stopped because carrier 12 is not arrived at.

According to the present invention as described above, there is no fear that the transport means for the carriers interfere with one another between the transport systems. In addition, the storing racks are made rotatable and the openings through which the carriers are put in and out can be provided at any of four sides of the stock unit body. Therefore, the present invention can provide, with more easiness, a stock unit which can meet any needs of the users.

What is claimed is:

1. A stock unit for storing carriers comprising; a case-shaped unit body provided with storing racks to store carriers for carrying plate-like semiconductor wafers or liquid crystal substrates inside plural box-like compartments provided on said racks, said storing racks being piled in plural layers at a certain interval in said case-shaped unit body; carrier mounting ports on which said carriers that are to be placed in and out of certain box-like compartments in said racks are temporarily mounted; means for transporting said carriers between said box-like compartments and said mounting ports; and means for sending air in a direction parallel to the surfaces of said wafers or substrates when said carriers are placed on each of said box-like compartments, mounting ports and transporting means; wherein said air flows upwardly through the center of said storing rack and outwardly over the carriers, and said wafers are substantially horizontally disposed when the carriers are positioned within said box-like compartments and vertically disposed when the carriers are positioned on the mounting ports.

2. The stock unit for storing carriers according to claim 1, wherein the storing rack is shaped substantially like a disk and is rotatable within the case-shaped stock unit body.

3. A stock unit for storing carriers, comprising: a case-shaped unit body provided with storing racks to store carriers for carrying plate-like semiconductor wafers or liquid crystal substrates inside plural box-like compartments provided on said racks; mounting ports on which said carriers that are to be placed in and out of certain box-like compartments in said racks are temporarily mounted; means for transporting said carriers between said box-like compartments and said mounting ports; and means for sending air in a direction parallel to the surfaces of said wafers or substrates when said carriers are placed on each of said box-like compartments, mounting ports and transporting means; wherein said air flows upwardly through the center of said storing rack and outwardly over the carriers, and said wafers are substantially horizontally disposed when the carriers are positioned within said box-like compartments and vertically disposed when the carriers are positioned on the mounting ports.

4. The stock unit for storing carriers according to claim 3, wherein said storing racks are piled in plural layers at a certain interval in the case-shape stock unit body.

5. The stock unit for storing carriers according to claim 3, wherein the storing rack is shaped substantially like a disk and is rotatable within the case-shaped stock unit body.

6. A stock unit for storing carriers comprising: plural case-shaped unit bodies provided with storing racks to store carriers for plate-like semiconductor wafer or liquid crystal substrates inside plural box-like compartments provided on said racks and piled in plural layers at a certain interval; plural mounting ports on which said carriers that are to be placed in and out of certain positions on desired storing racks are temporarily mounted and which are arranged to correspond to certain positions on said desired storing racks; means for transporting said carriers between certain positions on said desired storing racks and the mounting ports; and means for sending air in a direction parallel to the surfaces of said wafers or substrates when said carriers are placed on each of said box-like compartments, mounting ports and transporting means; wherein said air flows upwardly through the center of said storing rack and outwardly over the carriers, and said wafers are substantially horizontally disposed when the carriers are positioned within said box-like compartments and vertically disposed when the carriers are positioned on the mounting ports.

7. The stock unit for storing carriers according to claim 6, wherein the storing rack is shaped substantially like a disk and is rotatable within the case-shaped stock unit body.

* * * * *